(12) United States Patent
Kim et al.

(10) Patent No.: US 9,780,802 B1
(45) Date of Patent: Oct. 3, 2017

(54) TIME-INTERLEAVED ANALOG-DIGITAL CONVERTER AND CALIBRATION METHOD FOR THE SAME

(71) Applicant: Korea University Research and Business Foundation, Seoul (KR)

(72) Inventors: Chul Woo Kim, Seoul (KR); Yun Soo Park, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/362,416

(22) Filed: Nov. 28, 2016

(30) Foreign Application Priority Data

Aug. 12, 2016 (KR) ........................ 10-2016-0103052

(51) Int. Cl.
*H03M 1/10* (2006.01)
*H03M 1/12* (2006.01)

(52) U.S. Cl.
CPC ....... *H03M 1/1033* (2013.01); *H03M 1/1215* (2013.01); *H03M 1/1245* (2013.01)

(58) Field of Classification Search
CPC .......................... H03M 1/1033; H03M 1/1215
USPC ................. 341/155, 139, 159, 143, 120, 118
See application file for complete search history.

(56) References Cited

U.S. PATENT DOCUMENTS

| | | | | |
|---|---|---|---|---|
| 2011/0193732 A1* | 8/2011 | Sestok | ............... | H03M 1/1061 341/118 |
| 2011/0299630 A1* | 12/2011 | Petrovic | ............... | H04B 7/0408 375/340 |
| 2013/0141261 A1* | 6/2013 | Johancsik | ............... | H03M 1/54 341/118 |
| 2014/0152477 A1* | 6/2014 | Lewis | ................. | H03M 1/1061 341/122 |

* cited by examiner

*Primary Examiner* — Peguy Jean Pierre
(74) *Attorney, Agent, or Firm* — Fox Rothschild LLP

(57) ABSTRACT

Provided is a time-interleaved analog-digital converter including: a plurality of analog-digital converters which is located in each of a plurality of channels and converts an input analog signal into a plurality of partial digital signals; a plurality of sampling bandwidth adjusting units which is located in each of the plurality of channels and adjusts a plurality of sampling bandwidths of the plurality of channels in accordance with a plurality of bandwidth adjusting signals; and a sampling bandwidth control unit which estimates the plurality of sampling bandwidths and generates the plurality of bandwidth adjusting signals by which the plurality of sampling bandwidths matches each other.

18 Claims, 6 Drawing Sheets

[FIG. 1]
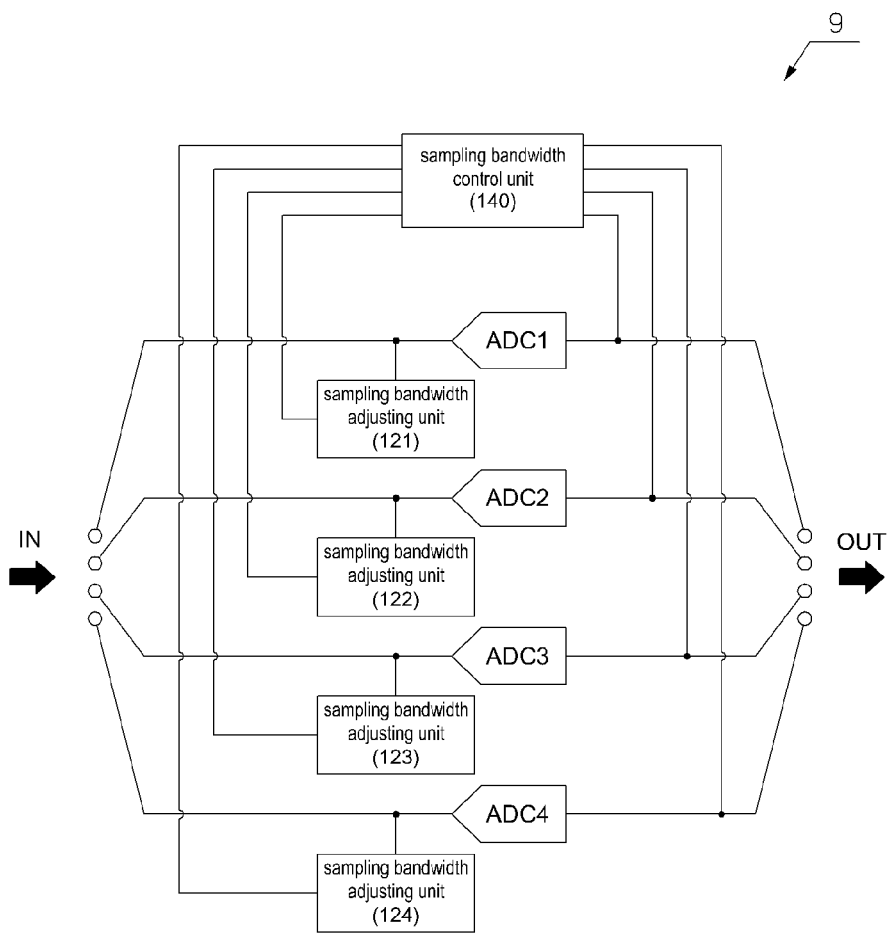

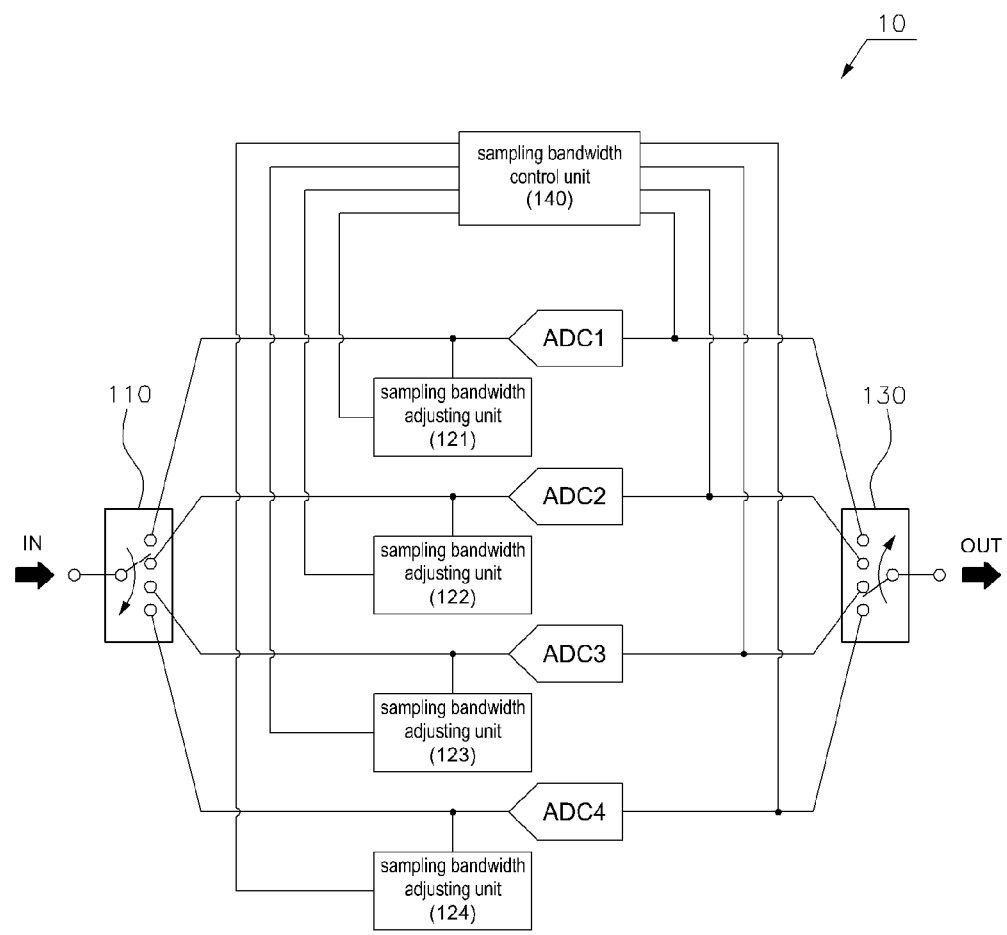
[FIG. 2]

[FIG. 3]
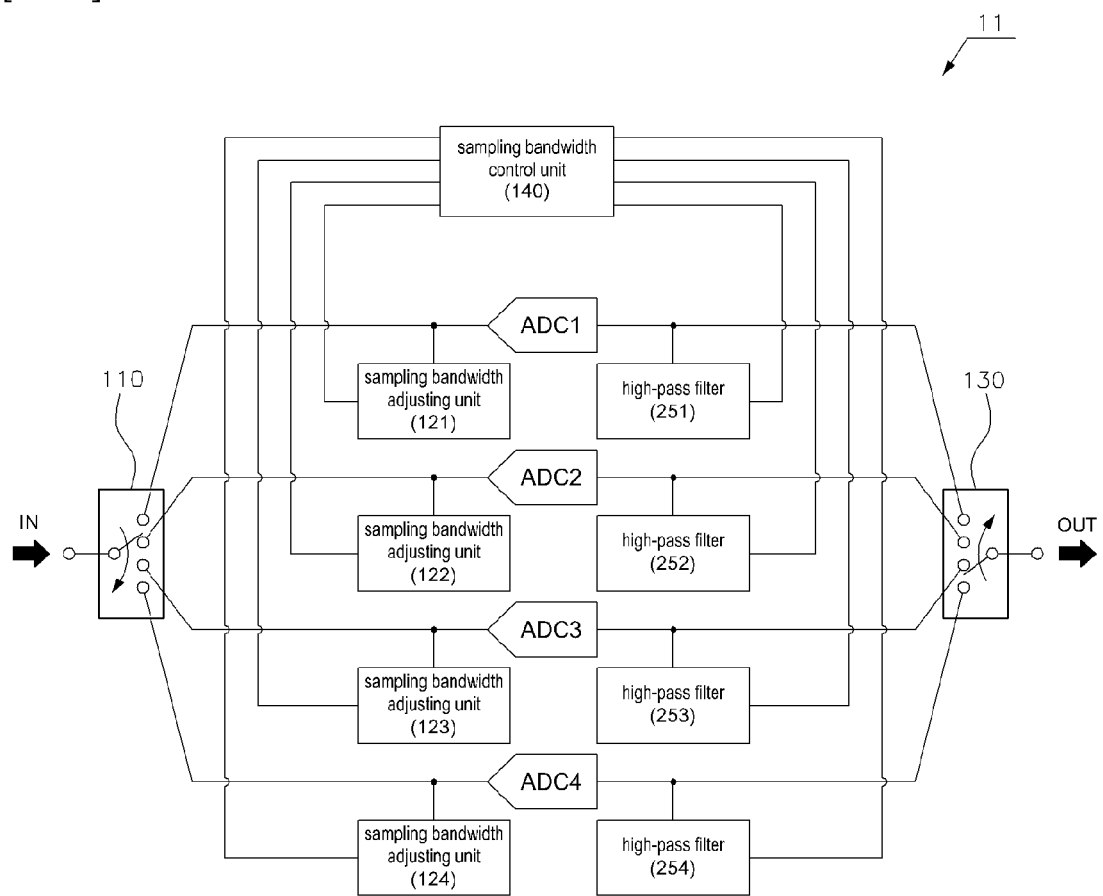

[FIG. 4]
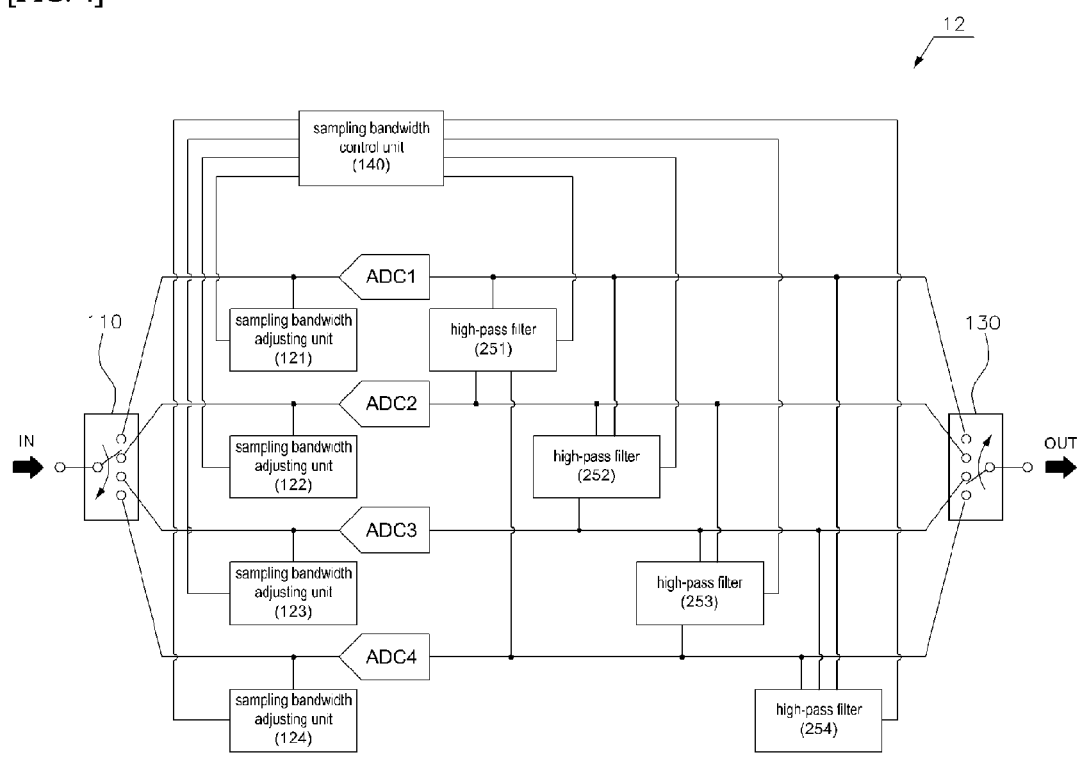

[FIG. 5]
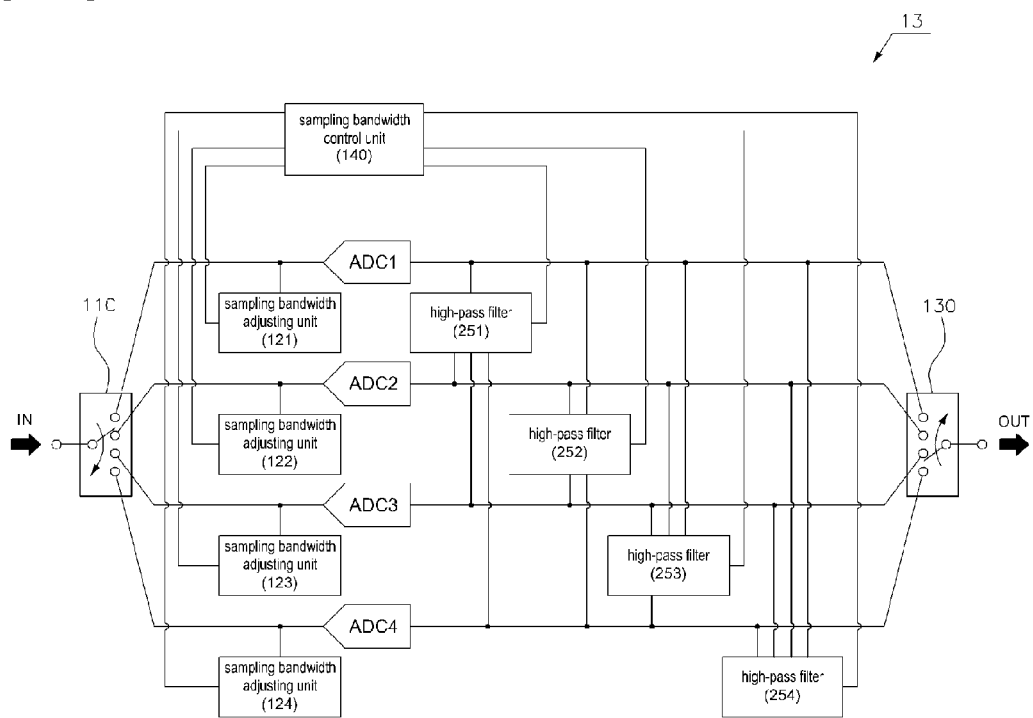

[FIG. 6]
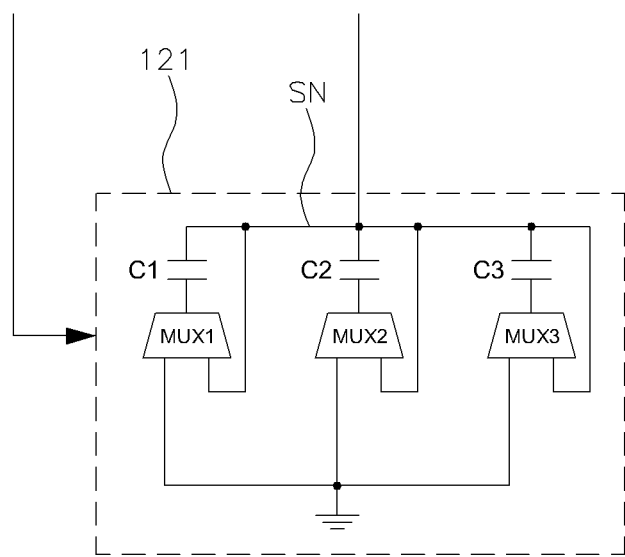

TIME-INTERLEAVED ANALOG-DIGITAL CONVERTER AND CALIBRATION METHOD FOR THE SAME

CROSS-REFERENCE TO RELATED APPLICATIONS

This application claims the priority of Korean Patent Application No. 10-2016-0103052 filed on Aug. 12, 2016, in the Korean Intellectual Property Office, the disclosure of which is incorporated herein by reference.

BACKGROUND

Field

The present disclosure relates to a time interleaved analog-digital converter and a calibration method for the same.

Description of the Related Art

In accordance with development of autonomous cars and Internet of things (IoT), demands for low-priced radars and wireless communication chips are being increased.

A time-interleaved analog-digital converter (time-interleaved ADC) is a device in which several analog-digital converters are connected in parallel to operate as one speedy analog-digital converter. The time-interleaved analog-digital converter may implement a high speed and high efficiency analog-digital converter through a low-priced CMOS process.

However, mismatches of gains, offsets, timings, and bandwidths between channels which are generated during a semiconductor process may cause deterioration of linearity of the time-interleaved analog-digital converter. Among these, the mismatches of timings and bandwidths may cause mismatch of phases in signals of the channels and may further cause a large error in a high frequency input.

Specifically, the mismatch of bandwidths causes the mismatch of gains, differently from the mismatch of timings and also causes non-linear phase and gain with respect to the input frequency, which may become a big difficulty to remove the mismatch of bandwidths.

This problem is disclosed in Patent Document 1.

RELATED ART DOCUMENT

Patent Document

[Patent Document 1] Korean Patent No. 10-1461784 (published on Nov. 7, 2014)

SUMMARY

The present disclosure has been made in an effort to provide a time-interleaved analog-digital converter which is capable of calibrating mismatch of bandwidths and a calibration method for the same.

According to an aspect to the present disclosure, there is provided a time-interleaved analog-digital converter. The time-interleaved analog-digital converter includes: a plurality of analog-digital converters which is located in each of a plurality of channels and converts an input analog signal into a plurality of partial digital signals; a plurality of sampling bandwidth adjusting units which is located in each of the plurality of channels and adjusts a plurality of sampling bandwidths of the plurality of channels in accordance with a plurality of bandwidth adjusting signals; and a sampling bandwidth control unit which estimates the plurality of sampling bandwidths and generates the plurality of bandwidth adjusting signals by which the plurality of sampling bandwidths matches each other.

The time-interleaved analog-digital converter may further include an input switching unit which selectively transmits the input analog signal to the plurality of channels; and an output switching unit which is connected to the plurality of channels to sequentially output the plurality of partial digital signals.

The sampling bandwidth control unit may estimate the plurality of sampling bandwidths using a plurality of gains for the plurality channels.

The sampling bandwidth control unit may estimate the sampling bandwidth in proportion to a size of the gain.

The sampling bandwidth control unit may generate the plurality of bandwidth adjusting signals so that the plurality of sampling bandwidths matches the smallest sampling bandwidth.

The time-interleaved analog-digital converter may further include a plurality of high-pass filters to which the plurality of partial digital signals is input. The sampling bandwidth control unit may calculate a gain of each channel using the partial digital signal which passes through the plurality of high-pass filters.

The plurality of sampling bandwidth adjusting unit may be connected to a corresponding sampling node of each channel.

The plurality of sampling bandwidth adjusting units may adjust a capacitance which is connected to the corresponding sampling node in accordance with the plurality of bandwidth adjusting signals.

The plurality of sampling bandwidth adjusting units may include: a plurality of capacitors whose one end is connected to the corresponding sampling node; and a plurality of multiplexers each having an output terminal to which the other ends of the plurality of capacitors are connected, a reference voltage, and the sampling node as an input terminal.

The plurality of sampling bandwidth adjusting units may control the plurality of corresponding multiplexers in accordance with the plurality of bandwidth adjusting signals to adjust the capacitance connected to the corresponding sampling node.

In the time-interleaved analog-digital converter, the plurality of gains may be calculated by a rate of amplitudes of the plurality of corresponding partial digital signals with respect to an analog signal.

The plurality of gains may be again of a high frequency domain.

The plurality of gains may be a gain for a frequency within a predetermined range from a Nyquist frequency.

The Nyquist frequency may be half a sampling frequency of the time-interleaved analog-digital converter.

According to another aspect of the present disclosure, there is provided a calibration method for solving mismatch of bandwidths between channels of a time-interleaved analog-digital converter. The calibration method includes: a plurality of analog-digital converting steps of converting an input analog signal to a plurality of partial digital signals corresponding to a plurality of channels; a plurality of sampling bandwidth adjusting steps of adjusting a plurality of sampling bandwidths of the plurality of channels in accordance with a plurality of bandwidth adjusting signals; and a sampling bandwidth control step of estimating the plurality of sampling bandwidths and generating the plurality of bandwidth adjusting signals by which the plurality of sampling bandwidths matches each other.

In the sampling bandwidth control step, the plurality of sampling bandwidths may be estimated using a plurality of gains of the plurality of channels.

In the sampling bandwidth control step, the sampling bandwidth may be estimated in proportion to a size of the gain.

In the sampling bandwidth control step, the plurality of bandwidth adjusting signals may be generated such that the plurality of sampling bandwidths matches the smallest sampling bandwidth.

The calibration method may further include a plurality of high-pass filter step of high-pass filtering the plurality of partial digital signals. In the sampling bandwidth control step, the partial digital signals which pass through the plurality of high-pass filter steps may be used to calculate a gain of each channel.

In the plurality of sampling bandwidth adjusting steps, a capacitance which is connected to a sampling node of each channel in accordance with the plurality of bandwidth adjusting signals may be adjusted.

According to the present disclosure, the time-interleaved analog-digital converter and the calibration method for the same may calibrate the mismatch of bandwidths.

BRIEF DESCRIPTION OF THE DRAWINGS

The above and other aspects, features and other advantages of the present disclosure will be more clearly understood from the following detailed description taken in conjunction with the accompanying drawings, in which:

FIG. 1 is a view for explaining a time-interleaved analog-digital converter according to an exemplary embodiment of the present disclosure;

FIG. 2 is a view for explaining an input switching unit and an output switching unit according to an exemplary embodiment of the present disclosure;

FIG. 3 is a view for explaining a plurality of high-pass filters according to an exemplary embodiment of the present disclosure;

FIG. 4 is a view for explaining a plurality of high-pass filters according to an exemplary embodiment of the present disclosure;

FIG. 5 is a view for explaining a plurality of high-pass filters according to an exemplary embodiment of the present disclosure; and FIG. 6 is a view for explaining a plurality of sampling bandwidth adjusting units according to an exemplary embodiment of the present disclosure.

DETAILED DESCRIPTION OF THE EMBODIMENT

Hereinafter, exemplary embodiments of the present invention will be described more fully with reference to the accompanying drawings for those skilled in the art to easily implement the present invention. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification. Reference numbers which have been explained in the prior description may be used in other drawings.

The size and thickness of the components shown the drawings are optionally determined for better understanding and ease of description, and the present invention is not limited to the examples shown in the drawings. In the drawings, thicknesses of several layers and regions may be exaggerated for clear expressions.

FIG. 1 is a view for explaining a time-interleaved analog-digital converter according to an exemplary embodiment of the present disclosure.

Referring to FIG. 1, a time-interleaved analog-digital converter 9 according to an exemplary embodiment of the present disclosure includes a plurality of sampling bandwidth adjusting units 121, 122, 123, and 124, a plurality of analog-digital converting units ADC1, ADC2, ADC3, and ADC4, and a sampling bandwidth control unit 140.

The plurality of analog-digital converting units ADC1, ADC2, ADC3, and ADC4 is located in a plurality of channels, respectively and converts an input analog signal into a plurality of partial digital signals.

The number of the plurality of channels of the time-interleaved analog-digital converter 9 is not specifically limited. Those skilled in the art may determine the number of channels in accordance with the performance of the plurality of analog-digital converters ADC1, ADC2, ADC3, and ADC4 and input/output to be finally implemented.

Hereinafter, it will be described that each of time-interleaved analog-digital converters 9, 10, 11, 12, and 13 illustratively includes four channels and four sampling bandwidth adjusting units 121, 122, 123, and 124 and four analog-digital converting units ADC1, ADC2, ADC3, and ADC4 in accordance with four channels (see FIGS. 2 to 5).

Each of analog-digital converting units ADC1, ADC2, ADC3, and ADC4 may adopt an analog-digital converter according to the related art.

Each of the plurality of sampling bandwidth adjusting units 121, 122, 123, and 124 is located in each of the plurality of channels and adjusts a plurality of sampling bandwidths of the plurality of channels in accordance with a plurality of bandwidth adjusting signals.

The sampling bandwidth adjusting unit 121 may be connected to an input terminal of the analog-digital converter ADC1. In this case, the input terminal may be a sampling node of the corresponding channel.

Similarly, the sampling bandwidth adjusting unit 122 may be connected to an input terminal of the analog-digital converter ADC2, the sampling bandwidth adjusting unit 123 may be connected to an input terminal of the analog-digital converter ADC3, and the sampling bandwidth adjusting unit 124 may be connected to an input terminal of the analog-digital converter ADC4.

The plurality of sampling bandwidth adjusting units 121, 122, 123, and 124 adjusts a capacitance which is connected to the corresponding sampling node in accordance with the plurality of bandwidth adjusting signals. The plurality of sampling bandwidths of the plurality of channels may be adjusted by adjusting the capacitance. Internal configurations of the plurality of sampling bandwidth adjusting units 121, 122, 123, and 124 will be described in more detail with reference to FIG. 6.

The sampling bandwidth control unit 140 estimates the plurality of sampling bandwidths and generates a plurality of bandwidth adjusting signals by which the plurality of sampling bandwidths matches each other.

The sampling bandwidth control unit 140 uses a plurality of gains for the plurality channels to estimate the plurality of sampling bandwidths. The plurality of gains may be calculated by a rate of amplitudes of the corresponding partial digital signals with respect to an analog signal.

In one exemplary embodiment, the plurality of gains may be a gain of a high frequency domain. In this case, the plurality of gains may be gains at a Nyquist frequency. Further, the plurality of gains may be gains with respect with a frequency with in a predetermined range from the Nyquist frequency.

The Nyquist frequency may correspond to half the sampling frequency of the time-interleaved analog-digital converter 9.

As one exemplary embodiment, the sampling bandwidth control unit 140 may estimate the sampling bandwidth in proportion to the size of the gain. That is, a channel having the largest gain may be estimated to have the largest sampling bandwidth and a channel having the smallest gain may be estimated to have the smallest sampling bandwidth.

Since inputs of all channels are based on one analog signal, it is assumed that all channels have the same input spectrum. Further, a value of a 3 dB-bandwidth may be inferred depending on the size of the gain of each channel so that it is understood that which channel has the smallest bandwidth.

The sampling bandwidth control unit 140 may generate a plurality of bandwidth adjusting signals so that the plurality of sampling bandwidths matches the smallest sampling bandwidth.

The plurality of generated bandwidth adjusting signals is input to the plurality of sampling bandwidth adjusting units 121, 122, 123, and 124 again. Therefore, the mismatch of bandwidths may be removed through a calibration process in which the plurality of sampling bandwidth adjusting units 121, 122, 123, and 124 adjusts the plurality of sampling bandwidths of the plurality of corresponding channels.

FIG. 2 is a view for explaining an input switching unit and an output switching unit according to an exemplary embodiment of the present disclosure.

Referring to FIG. 2, a time-interleaved analog-digital converter 10 according to an exemplary embodiment of the present disclosure includes an input switching unit 110, a plurality of sampling bandwidth adjusting units 121, 122, 123, and 124, a plurality of analog-digital converters ADC1, ADC2, ADC3, and ADC4, an output switching unit 130, and a sampling bandwidth control unit 140.

The plurality of sampling bandwidth adjusting units 121, 122, 123, and 124, the plurality of analog-digital converting units ADC1, ADC2, ADC3, a d ADC4, and the sampling bandwidth control unit 140 of the time-interleaved analog-digital converter 10 are same as and similar to those of the time-interleaved analog-digital converter 9 of FIG. 1, so that redundant description will be omitted.

The input switching unit 110 may selectively transmit an analog signal which is an input signal to the plurality of channels.

The output switching unit 130 may be connected to the plurality of channels to sequentially output the plurality of partial digital signals. The plurality of partial digital signals which is sequentially output forms one output digital signal to serve as an output signal of the time-interleaved analog-digital converter 10.

The time-interleaved analog-digital converter 10 according to the exemplary embodiment of FIG. 2 and the time-interleaved analog-digital converter 9 according to the exemplary embodiment of FIG. 1 perform the same bandwidth calibration function. However, in order to describe that the time-interleaved analog-digital converter 10 and the time-interleaved analog-digital converter 9 may be connected to peripheral electronic components by various methods, the exemplary embodiments are illustrated in different drawings. Accordingly, those skilled in the art may specifically modify and optimize the input/output connection relationship between the time-interleaved analog-digital converters and peripheral electronic components depending on the situation.

FIG. 3 is a view for explaining a plurality of high-pass filters according to an exemplary embodiment of the present disclosure.

Referring to FIG. 3, a time-interleaved analog-digital converter 11 according to an exemplary embodiment of the present disclosure further includes a plurality of high-pass filters 251, 252, 253, and 254, as compared with the time-interleaved analog-digital converter 10 of FIG. 2. Since other configurations are same as and similar to the time-interleaved analog-digital converter 10, redundant description will be omitted.

The plurality of high-pass filters 251, 252, 253, and 254 receives a plurality of partial digital signals of the corresponding channels. In the partial digital signals which pass through the high-pass filters 251, 252, 253, and 254, high frequency components remain.

The sampling bandwidth control unit 140 uses the plurality of partial digital signals which passes through the plurality of high-pass filters 251, 252, 253, and 254 to calculate a gain of each channel.

The configuration is formed based on a theory that as the higher the input frequency of the input signal is, the more precisely the bandwidth is estimated. Therefore, the time-interleaved analog-digital converter 11 may more precisely estimate the bandwidth so that the bandwidth calibration may be more precisely performed.

In this exemplary embodiment, the high-pass filter 251 receives and filters a partial digital signal of the first channel and outputs the partial digital signal to the sampling bandwidth control unit 140. Similarly, the high-pass filter 252 receives and filters a partial digital signal of the second channel and outputs the partial digital signal to the sampling bandwidth control unit 140. The high-pass filter 253 receives and filters a partial digital signal of the third channel and outputs the partial digital signal to the sampling bandwidth control unit 140. The high-pass filter 254 receives and filters a partial digital signal of the fourth channel and outputs the partial digital signal to the sampling bandwidth control unit 140.

The connection relationship between the plurality of high-pass filters 251, 252, 253, and 254 and the plurality of channels may vary, which will be described in more detail with reference to FIGS. 4 and 5.

FIG. 4 is a view for explaining a plurality of high-pass filters according to an exemplary embodiment of the present disclosure.

In a time-interleaved analog-digital converter 12 according to an exemplary embodiment of FIG. 4, a plurality of high-pass filters 251, 252, 253, and 254 is connected to a plurality of channels, which is different from the exemplary embodiment of FIG. 3.

In this exemplary embodiment, the high-pass filter 251 receives and filters partial digital signals of a first channel, a second channel, and a fourth channel and outputs the partial digital signals to the sampling bandwidth control unit 140. Similarly, the high-pass filter 252 receives and filters partial digital signals of the first channel, the second channel, and a third channel and outputs the partial digital signals to the sampling bandwidth control unit 140. The high-pass filter 253 receives and filters partial digital signals of the second channel, the third channel, and the fourth channel and outputs the partial digital signals to the sampling bandwidth control unit 140. The high-pass filter 254 receives and filters partial digital signals of the first channel, the third channel, and the fourth channel and outputs the partial digital signals to the sampling bandwidth control unit 140.

FIG. 5 is a view for explaining a plurality of high-pass filters according to an exemplary embodiment of the present disclosure.

In a time-interleaved analog-digital converter 13 according to an exemplary embodiment of FIG. 5, a plurality of high-pass filters 251, 252, 253, and 254 is connected to all channels, which is different from the exemplary embodiments of FIGS. 3 and 4.

In this exemplary embodiment, the high-pass filter 251 receives and filters partial digital signals of a first channel, a second channel, a third channel, and a fourth channel and outputs the partial digital signals to the sampling bandwidth control unit 140. Similarly, the high-pass filter 252 receives and filters partial digital signals of the first channel, the second channel, the third channel, and the fourth channel and outputs the partial digital signals to the sampling bandwidth control unit 140. The high-pass filter 253 receives and filters partial digital signals of the first channel, the second channel, the third channel, and the fourth channel and outputs the partial digital signals to the sampling bandwidth control unit 140. The high-pass filter 254 receives and filters partial digital signals of the first channel, the second channel, the third channel, and the fourth channel and outputs the partial digital signals to the sampling bandwidth control unit 140.

FIGS. 3 to 5 illustrate various connection relationships between the plurality of high-pass filters 251, 252, 253, and 254 and the plurality of channels. However, those skilled in the art may adopt other appropriate connection relationship to implement a function of the present disclosure.

FIG. 6 is a view for explaining a plurality of sampling bandwidth adjusting unit according to an exemplary embodiment of the present disclosure.

Referring to FIG. 6, a sampling bandwidth adjusting unit 121 is enlarged. Since other sampling bandwidth adjusting units 122, 123, and 124 also have the same configuration as the sampling bandwidth adjusting unit 121, redundant description will be omitted.

The sampling bandwidth adjusting unit 121 may be connected to a sampling node SN of the corresponding channel.

The sampling bandwidth adjusting unit 121 adjusts a capacitance which is connected to the corresponding sampling node SN in accordance with the bandwidth adjusting signal. For example, as the capacitance which is connected to the corresponding sampling node SN is increased, the sampling bandwidth of the corresponding channel may be reduced.

The sampling bandwidth adjusting unit 121 may include a plurality of capacitors C1, C2, and C3 with one end which is connected to the corresponding sampling node SN. Further, the sampling bandwidth adjusting unit 121 includes a plurality of multiplexers MUX1, MUX2, and MUX3 which has an output terminal to which the other ends of the plurality of capacitors C1, C2, and C3 are connected, a reference voltage (for example, a ground voltage), and a corresponding sampling node SN as an input terminal.

The sampling bandwidth adjusting unit 121 controls the plurality of corresponding multiplexers MUX1, MUX2, and MUX3 in accordance with the plurality of bandwidth adjusting signals to adjust the capacitance which is connected to the corresponding sampling node.

For example, when both one end and the other end of the capacitor C1 are connected to the sampling node SN through the multiplexer MUX1, voltages at both ends of the capacitor C1 are equal to each other. Therefore, the capacitor C1 may be electrically ignored. In this case, when the other ends of the capacitors C2 and C3 are connected to the reference voltage through the multiplexers MUX2 and MUX3, the capacitance of the sampling node SN may be determined by the capacitors C2 and C3 excluding the capacitor C1.

In this exemplary embodiment, even though three capacitors C1, C2, and C3 and three multiplexers MUX1, MUX2, and MUX3 are provided, the number of capacitors and the number of multiplexers may be two or less or four or more. That is, the number of capacitors C1, C2, and C3 and the number of multiplexers MUX1, MUX2, and MUX3 may be determined by intention of those skilled in the art that how much the capacitance is changed.

In one exemplary embodiment, the capacitances of the capacitors C1, C2, and C3 may be equal to each other. By doing this, linear change of the capacitance may be allowed.

In other exemplary embodiment, the capacitances of the capacitors C1, C2, and C3 may be different from each other. In this case, even though the reduced number of capacitors is used, various capacitances to be achieved may be created.

Since the time-interleaved analog-digital converters 9, 10, 11, 12, and 13 according to the exemplary embodiments actively adjust the sampling bandwidth, a lookup table (LUT) is not necessary. Therefore, a memory capacity may be reduced. The sampling bandwidth calibration may be performed by a product including the time-interleaved analog-digital converters 10 and 20 at any time.

The time-interleaved analog-digital converters 9, 10, 11, 12, and 13 according to an exemplary embodiment of the present invention suggests an algorithm which measures the mismatch of the bandwidths between channels in a digital domain to remove the mismatch in an analog domain. Since the algorithm has low complexity as compared with the algorithm of the related art, the algorithm may be easily implemented by a semiconductor chip. Therefore, the time-interleaved analog-digital converters 9, 10, 11, 12, and 13 having low power consumption at a low cost may be implemented.

The above-referred drawings and the detailed description of the present disclosure are provided for illustrative purposes only but not intended to limit the scope of the present disclosure described in the appending claims. Therefore, it will be appreciated to those skilled in the art that various modifications are made and other equivalent embodiments are available. Accordingly, the actual scope of the present invention must be determined by the spirit of the appended claims.

What is claimed is:

1. A time-interleaved analog-digital converter, comprising:

a plurality of analog-digital converters which is located in each of a plurality of channels and converts an input analog signal into a plurality of partial digital signals;

a plurality of sampling bandwidth adjusting units which is located in each of the plurality of channels and adjusts a plurality of sampling bandwidths of the plurality of channels in accordance with a plurality of bandwidth adjusting signals; and a sampling bandwidth control unit which estimates the plurality of sampling bandwidths and generates the plurality of bandwidth adjusting signals by which the plurality of sampling bandwidths matches each other;
wherein the sampling bandwidth control unit estimates the plurality of sampling bandwidths using a plurality of gains for the plurality of channels.

2. The time-interleaved analog-digital converter according to claim 1, further comprising:
an input switching unit which selectively transmits the input analog signal to the plurality of channels; and
an output switching unit which is connected to the plurality of channels to sequentially output the plurality of partial digital signals.

3. The time-interleaved analog-digital converter according to claim 1, wherein the sampling bandwidth control unit estimates the sampling bandwidth in proportion to a size of the gain.

4. The time-interleaved analog-digital converter according to claim 1, wherein the sampling bandwidth control unit generates the plurality of bandwidth adjusting signal such that the plurality of sampling bandwidth matches a smallest sampling bandwidth.

5. The time-interleaved analog-digital converter according to claim 3, further comprising:
a plurality of high-pass filters to which the plurality of partial digital signals is input,
wherein the sampling bandwidth control unit calculates a gain of each channel using the partial digital signal which passes through the plurality of high-pass filters.

6. The time-interleaved analog-digital converter according to claim 1, wherein the plurality of sampling bandwidth adjusting unit is connected to a corresponding sampling node of each channel.

7. The time-interleaved analog-digital converter according to claim 6, wherein the plurality of sampling bandwidth adjusting units adjusts a capacitance which is connected to the corresponding sampling node in accordance with the plurality of bandwidth adjusting signals.

8. The time-interleaved analog-digital converter according to claim 7, wherein the plurality of sampling bandwidth adjusting units includes:
a plurality of capacitors each having one end which is connected to the corresponding sampling node; and
a plurality of multiplexers each having an output terminal to which the other ends of the plurality of capacitors are connected, and having an input terminal connected to a reference voltage and the sampling node.

9. The time-interleaved analog-digital converter according to claim 8, wherein the plurality of sampling bandwidth adjusting unit controls the plurality of corresponding multiplexers in accordance with the plurality of bandwidth adjusting signals to adjust the capacitance connected to the corresponding sampling node.

10. The time-interleaved analog-digital converter according to claim 1, wherein the plurality of gains is calculated by a rate of amplitudes of the plurality of corresponding partial digital signals with respect to an analog signal.

11. The time-interleaved analog-digital converter according to claim 1, wherein the plurality of gains is a gain of a high frequency domain.

12. The time-interleaved analog-digital converter according to claim 11, wherein the plurality of gains is a gain for a frequency within a predetermined range from a Nyquist frequency.

13. The time-interleaved analog-digital converter according to claim 12, wherein the Nyquist frequency is half a sampling frequency of the time-interleaved analog-digital converter.

14. A calibration method for solving mismatch of bandwidths between channels of a time-interleaved analog-digital converter, the method comprising:
a plurality of analog-digital converting steps of converting an input analog signal into a plurality of partial digital signals corresponding to a plurality of channels;
a plurality of sampling bandwidth adjusting steps of adjusting a plurality of sampling bandwidths of the plurality of channels in accordance with a plurality of bandwidth adjusting signals; and
a sampling bandwidth control step of estimating the plurality of sampling bandwidths and generating the plurality of bandwidth adjusting signals by which the plurality of sampling bandwidths matches each other;
wherein in the sampling bandwidth control step, the plurality of sampling bandwidths is estimated using a plurality of gains of the plurality of channels.

15. The calibration method according to claim 14, wherein in the sampling bandwidth control step, the sampling bandwidth is estimated in proportion to a size of the gain.

16. The calibration method according to claim 14, wherein in the sampling bandwidth control step, the plurality of bandwidth adjusting signals is generated such that the plurality of sampling bandwidths matches a smallest sampling bandwidth.

17. The calibration method according to claim 15, further comprising:
a plurality of high-pass filter step of high-pass filtering the plurality of partial digital signals,
wherein in the sampling bandwidth control step, the partial digital signals which pass through the plurality of high-pass filter steps are used to calculate a gain of each channel.

18. The calibration method according to claim 17, wherein in the plurality of sampling bandwidth adjusting steps, an capacitance which is connected to a sampling node of each channel in accordance with the plurality of bandwidth adjusted signals is adjusted.

\* \* \* \* \*